(12) United States Patent
Hofstetter et al.

(10) Patent No.: US 9,472,252 B2
(45) Date of Patent: Oct. 18, 2016

(54) APPARATUSES AND METHODS FOR IMPROVING RETENTION PERFORMANCE OF HIERARCHICAL DIGIT LINES

(71) Applicant: Micron Technology, Inc., Boise, ID (US)

(72) Inventors: Ryan Hofstetter, Boise, ID (US); Adam El-Mansouri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 13/843,209

(22) Filed: Mar. 15, 2013

(65) Prior Publication Data

US 2014/0268974 A1   Sep. 18, 2014

(51) Int. Cl.
*G11C 5/06* (2006.01)
*G11C 7/18* (2006.01)

(52) U.S. Cl.
CPC ..................... *G11C 7/18* (2013.01)

(58) Field of Classification Search
CPC ...................................... G11C 5/063
USPC ..................... 365/63, 189.02, 205
See application file for complete search history.

(56) References Cited

U.S. PATENT DOCUMENTS

| | | | | |
|---|---|---|---|---|
| 5,818,771 A | * | 10/1998 | Yasu et al. | 365/195 |
| 5,856,940 A | * | 1/1999 | Rao | 365/149 |
| 5,862,072 A | * | 1/1999 | Raad et al. | 365/63 |
| 6,181,620 B1 | * | 1/2001 | Agata et al. | 365/203 |
| 7,723,755 B2 | * | 5/2010 | Lee et al. | 257/211 |
| 7,929,329 B2 | | 4/2011 | Shori et al. | |
| 2005/0041512 A1 | * | 2/2005 | Kim | 365/230.03 |
| 2007/0242539 A1 | * | 10/2007 | Ilda | 365/203 |
| 2012/0147686 A1 | * | 6/2012 | Takayama et al. | 365/203 |
| 2012/0218845 A1 | * | 8/2012 | Takayama et al. | 365/201 |

OTHER PUBLICATIONS

Non-Volatile Dynamic Random-Access Memory Cell With Built-In Boosting, IBM Technical Disclosure Bulletin, vol. 28, Issue 3, pp. 1182-1183, Aug. 1985.*

* cited by examiner

*Primary Examiner* — Hoai V Ho
(74) *Attorney, Agent, or Firm* — Dorsey & Whitney LLP

(57) ABSTRACT

Apparatuses and methods for improving retention performance of hierarchical digit lines are disclosed herein. An example apparatus may include a first digit line portion and a second digit line portion. The apparatus may further include a first selector configured to selectively couple the first digit line portion to the second digit line portion based, at least in part, on a first control signal. The apparatus may further include a second selector configured to selectively couple the second digit line portion to a voltage based, at least in part, on a second control signal.

24 Claims, 4 Drawing Sheets

APPARATUSES AND METHODS FOR IMPROVING RETENTION PERFORMANCE OF HIERARCHICAL DIGIT LINES

TECHNICAL FIELD

Embodiments of the present invention relate generally to semiconductor memory, and more specifically, in one or more described embodiments, to hierarchical digit lines.

BACKGROUND

In various memories, such as dynamic random access memory (DRAM), data may be read from or provided to memory cells over digit lines using sense amplifiers. Typically, sense amplifiers are coupled to digit lines and are configured to sense data on the digit lines and amplify the sensed data. In between various operations in which sense amplifiers provide data to and/or receive data from respective memory cells, charge may leak from or to one or more memory cells, resulting in corruption of data.

In operation, one or more digit lines may be held at a relatively high supply voltage, such as an internal supply voltage VDD, and charge may leak into memory cells storing a logical "0" and corrupt data stored therein. The longer a digit line is held at the relatively high supply voltage, the greater the chance of data being corrupted as a result of the leakage. A measurement of memory performance may be how long a memory cell retains data under these circumstances. As memory density and complexity has increased over time, retention of memory cells under these circumstances has decreased. For example, in the industry transition to smaller memory cell configurations, data retention has decreased significantly. While in some instances, it may be possible to ensure that a digit line is not maintained at the relatively high supply voltage, this approach may not be available for all desired memory implementations.

DETAILED DESCRIPTION

Apparatuses and methods for improving retention performance of hierarchical digit lines are disclosed herein. As will be explained in more detail below, in accordance with one or more embodiments of the invention, portions of a digit line may be maintained at a supply voltage during a memory operation such that leakage of memory cells may be reduced. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
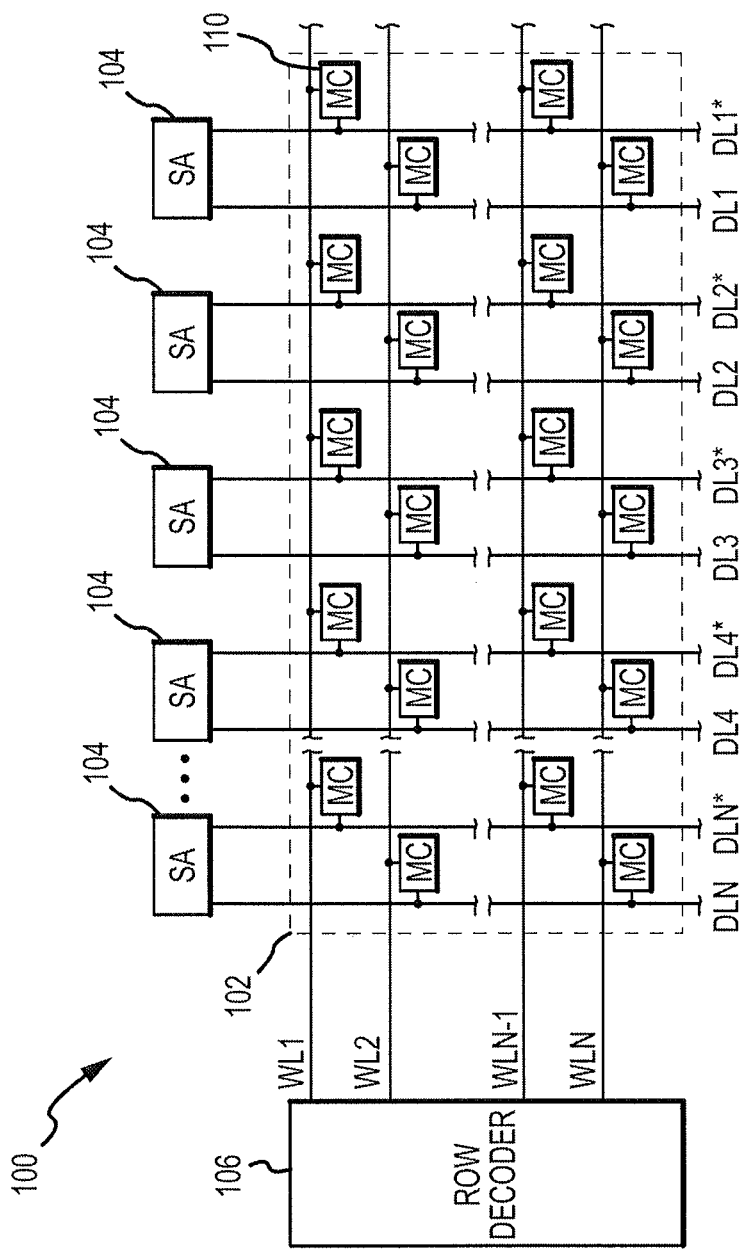
FIG. 1 is a schematic block diagram of an apparatus including an embodiment of the present invention.

FIG. 1 is a schematic block diagram of an apparatus 100 including an embodiment of the present invention. The apparatus 100 may include an array 102, row decoders 106, and sense amplifiers 104. The array 102 may include a plurality of pairs of complementary digit lines DL1, DL1*-DLN, DLN*. Each pair of digit lines DL1, DL1*-DLN, DLN* may be coupled to a respective sense amplifier 104 and a respective plurality of memory cells 110. While the array 102 has been shown as having a folded digit line architecture, it will be appreciated that additionally or alternatively, other implementations, such as an open digit line architecture, may be used as well.

Each sense amplifier 104 may comprise any sense amplifier known in the art, now or in the future, and may be configured to sense and/or latch data stored in a memory cell 110 coupled to an associated digit line. Sensed data may subsequently be provided from a sense amplifier 104 to external circuitry, such as a data bus (not shown). Each of the plurality of memory cells 110 may comprise any known type of memory cell, including volatile memory cells, such as dynamic random access memory (DRAM) cells, and non-volatile memory cells, such as flash memory cells (e.g., NAND) and phase change memory (PCM) cells.

The array 102 may further include a plurality of word lines WL1-WLN that may each be coupled to a row decoder 106. The row decoder 106 may be any row decoder known in the art, now or in the future. The row decoder 106 may be configured to activate a word line WL1-WLN associated with a decoded row address.

Examples of memory access operations include read operations and write operations. Read and write operations may be performed responsive to read and write commands, respectively. During an example read operation, the row decoder 106 may decode a row address provided to the row decoder 106 and activate a respective word line WL1-WLN corresponding to the decoded row address. The memory cells 110 coupled to the activated word lines WL1-WLN may provide stored data to an associated digit line DL1, DL1*-DLN, DLN* such that the data may be sensed and amplified by a respective sense amplifier 104. Once the data has been sensed and amplified by the sense amplifier 104, the data may then be provided to external circuitry as described above. Following the sensing and amplification of the data, the row decoder 106 may deactivate the activated word lines and the digit lines DL1, DL1*-DLN, DLN* precharged in response to a precharge command.

During an example write operation, the memory cells 110 to which data are to be written are accessed as previously described above for the example read operation. However, before the activated word lines are deactivated, data (e.g., write data) is provided to the sense amplifiers 104, and driven over the associated digit line DL1, DL1*-DLN, DLN* to be stored by the respective memory cells 110 coupled to the activated word lines WL1-WLN. Following the storing of the data by the respective memory cells 110, the row decoder 106 may deactivate the activated word lines and the digit lines DL1, DL1*-DLN, DLN* may be precharged in response to a precharge command.

Each of the digit lines DL1, DL1*-DLN, DLN* may comprise a hierarchical digit line. For example, each digit line DL1, DL1*-DLN, DLN* may include a first digit line portion and one or more second digit line portions that may be selectively coupled to the first digit line portion using, for instance, one or more selectors. A second digit line portion may be coupled to a plurality of memory cells 110 and may receive data from and/or provide data to a respective sense amplifier 104 by being coupled to a first digit line portion. In this manner, memory cells 110 may be selectively coupled to sense amplifiers 104 during memory operations.

Figure 2:
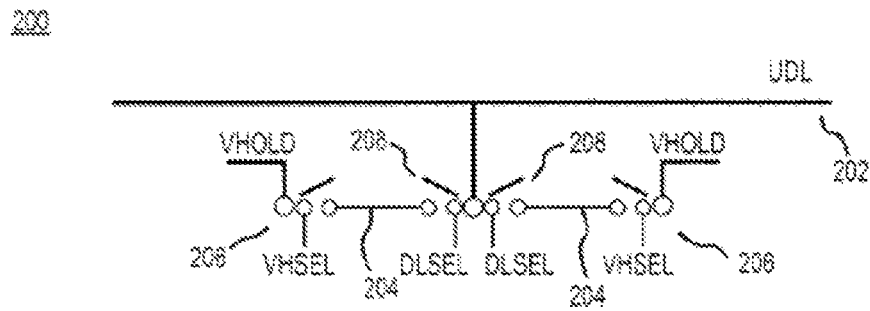
FIG. 2 is a schematic diagram of a portion of a digit line according to an embodiment of the present invention.

FIG. 2 is a schematic diagram of a digit line 200 according to an embodiment of the present invention. The digit line 200 may be used to implement, for instance, one or more of the digit lines DL1, DL1*-DLN, DLN* of FIG. 1.

The digit line 200 may include a first digit line portion 202, second digit line portions 204, and selectors 206, 208. The selectors 208 may each comprise a switch (e.g., transistor, multiplexer, and/or pass gate) and may be coupled to the first digit line portion 202 and a respective second digit line portion 204. The first digit line portion 202 may be coupled to a respective sense amplifier (e.g., sense amplifier 104). The second digit line portion 204 may be coupled to a plurality of memory cells (e.g., memory cells 110). The second digit line portions 204 may be implemented as buried digit lines, and the first digit line portions 202 may be implemented as metal digit lines, although it will be appreciated that the first digit line portions 202 and the second digit line portions 204 may be implemented as other types of digit lines as well. In some embodiments, the second digit line portions 204 may be considered as "lower" digit lines and the first digit line portions 202 may be considered as "upper" digit lines.

Each selector 208 may be configured to selectively couple the first digit line portion 202 to a respective second digit line portion 204 based, at least in part, on a control signal DLSEL. Each second digit line portion 204 may further be coupled to a selector 206. Each selector 206 may comprise a switch and may be configured to selectively couple a respective second digit line portion 204 to a hold voltage VHOLD based, at least in part, on a control signal VHSEL. In some embodiments, the selectors 206, 208 may be configured to couple the first digit line portion 202 to the second digit line portion 204 responsive, for example, at least in part, to at least one of an activate command or a precharge command. Examples of the VHOLD voltage may include, but are not limited to, ground, VDD, and/or may be a precharge voltage. The DLSEL signal and the VHSEL signal may be provided to the selectors 208, 206, respectively, from control circuitry, such as controller (not shown), that provide control signals to control internal operations of a memory.

By selectively coupling a second digit line portion 204 to a first digit line portion 202 and/or the VHOLD voltage, the second digit line portion 204 may be maintained at the VHOLD voltage during at least part of a memory access operation (e.g., read, write). Thus, in contrast to conventional memories, the second digit line portion is held at the VHOLD (e.g., lower) voltage rather than a relatively high supply portion for at least a portion of a [memory operation]. Charge leakage to and/or from memory cells, such as the memory cells 110 of FIG. 1, may be reduced during the memory access operation because the voltage differential resulting from the VHOLD voltage coupled to the second digit line portion 204 may be reduced in comparison to the voltage differential resulting from a supply voltage coupled to a second digit line portion in conventional memories. In at least one embodiment, leakage may be reduced for memory cells 110 proximate the accessed memory cells, for example, memory cells coupled to word lines adjacent the activated word line, and/or memory cells 110 coupled to an active digit line.

As illustrated in FIG. 2, the digit line 200 may include a first digit line portion 202 and a second digit line portion 204. In some embodiments, one or more second digit line portions 204 may be selectively coupled to the first digit line portion 202 by a respective selector 208. For instance, a single second digit line portion 204 may be coupled through a respective selector 208 to a respective first digit line portion 202 [during a sensing operation] based, at least in part, on the DLSEL signal. In other embodiments, two, four, or any other number of second digit line portions 204 may be selectively coupled through a respective selector 208 to the first digit line portion 202 based, at least in part, on the DLSEL signal. By way of example, during a sense operation, one of a plurality second digit line portions may be selectively coupled to the first digit line portion 202 while the remaining second digit line portions of the plurality of second digit line portions 204 remain decoupled.

The number of second digit line portions 204 may be based, for example, at least in part, on the amount of charge a memory cell may store and/or one or more capacitances. In some embodiments, the number of second digit line portions 204 may be based, at least in part, on the number of memory cells 110 coupled to a digit line. By way of example, in at least one embodiment, each memory cell 110 may be associated with a respective second digit line portion 204.

Additionally, in some embodiments, selectors 206, 208 may be controlled with a respective control signal. For example, in one embodiment, each selector 208 may receive a respective DLSEL control signal such that each second digit line portion 204 may be selectively coupled to the first digit line portion 202 independently of the coupling of other second digit line portions 204.

Figure 3A:
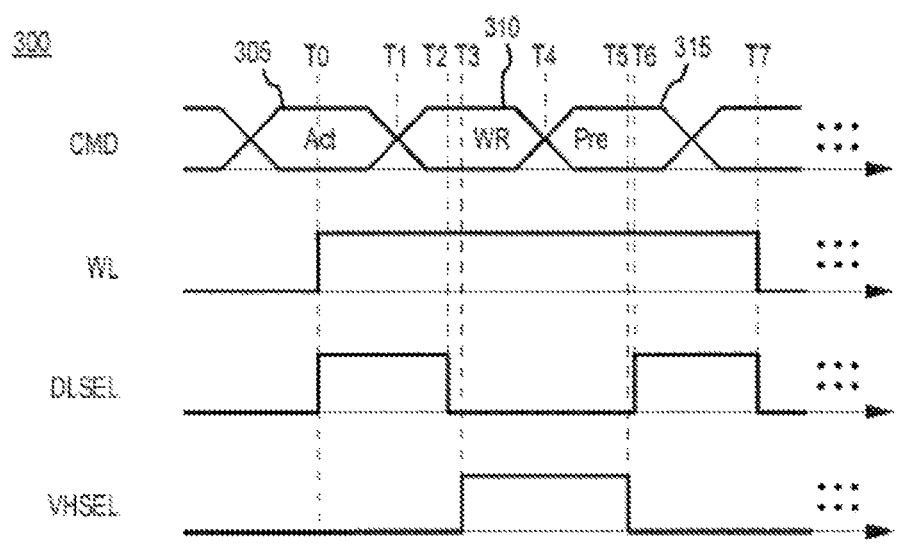
FIGS. 3A-B are timing diagrams illustrating various signals of a memory operation according to embodiments of the present invention.

FIG. 3A is a timing diagram 300 illustrating various signals during a memory access operation according to an embodiment of the present invention. At time T0, one or more of the word lines WL1-WLN may be activated, for example, responsive to an activate command 305. The one or more activated word lines may be associated with a decoded row address corresponding to the activate command 305, and the row may remain active until a precharge command 315 is provided. The control signal DLSEL may also be asserted, for instance, by a controller, causing a first digit line portion 202 to be coupled to a second digit line portion 204 by a selector 208. As a result, a memory cell 110 coupled to the activated word line and the digit line 200 may provide data to a sense amplifier 104 over a second digit line portion 204 and a first digit line portion 202. The data may be sensed and amplified by the sense amplifier 104.

At time T0, an active command may be provided, and in response, at time T2, the DLSEL signal may no longer be asserted. The selector 208 may decouple the first digit line portion 202 from the second digit line portion 204. At time T3, the VHSEL signal may be asserted. The second digit line portion 204 may accordingly be coupled to the VHOLD voltage by the selector 206 and maintained at the VHOLD voltage. As described, holding a second digit line portion 204 at the VHOLD voltage may reduce charge leakage of one or more memory cells. While the second digit line portions 204 are held at the VHOLD voltage, the sense amplifiers 104 may be provided with write data associated with the write command 310 from external circuitry, which is driven onto the first digit line portions 202. The second digit line portions 204 may be maintained at the VHOLD voltage until a precharge command 315 is provided at time T4.

In response to the precharge command 315, at time T5, the control signal VHSEL may no longer be asserted, causing the selector 206 to decouple the second digit line portion 204 from the supply voltage VHOLD. At time T6, the control signal DLSEL may be asserted, thereby causing the selector 208 to couple the second digit line portion 204 to the first digit line portion 202. Once the selector 208 has coupled the second digit line portion 204 to the first digit line portion 202, write data driven on the first digit line portion 202 may be provided to the memory cells 110 over the coupled second digit line portions for storing. At time T7, the activated word line may be deactivated, and the first digit line portions 202 decoupled from the second digit line portions 204.

Figure 3B:
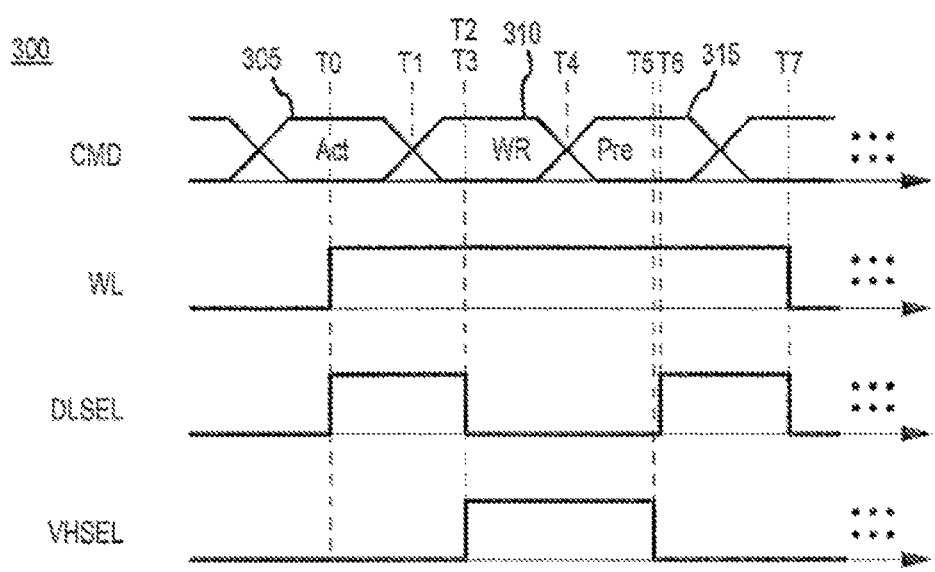

While the times T2 and T3, and T5 and T6 have been described as occurring in a particular sequence, it will be appreciated that in some embodiments, times T2 and T3, and times T5 and T6 may occur at a same time, respectively. For example, in at least one embodiment (shown in FIG. 3B), control signals DLSEL and VHSEL may change states at a same time. Accordingly, selectors 206, 208 may couple or decouple second digit line portions from the first digit line portion 204 and supply voltage VHOLD, respectively, at a same time. In this manner, second digit line portions 204 may be prevented from having a "floating" state.

The timing diagram 300 has been described with reference to a write operation. It will be appreciated, however, that operation as described herein may be used for other memory operations as well, such as read operations and/or refresh operations. For example, in at least one embodiment, the write command 310 may instead comprise a read command or a refresh command and operation may be modified accordingly (e.g., no write would take place for a read operation).

The timing diagram 300 has been described with reference to a write operation 310 occurring between an activate command 305 and a precharge command 315. In some embodiments, multiple commands may be performed between an activate command 305 and precharge command 315, such as back-to-back write commands. In this manner, write data may be provided to the sense amplifiers 104 for each of a plurality of write commands while the first digit line portion 202 is decoupled from one or more second digit line portions 204. By way of example, the write command 310 may be provided such that write data is provided to the sense amplifiers 104 as described. A second write command may be provided thereafter and new write data may be provided to the sense amplifiers 104. Because the first digit line portion 204 may be decoupled from second digit line portions 202, the write data associated with the command 310 may not be provided to memory cells 110. However, because the sense amplifiers 104 may latch the new write data, the new write data may be provided to the memory cells 110 during the precharge command 315. By maintaining the second digit line portions 202 at the supply voltage VHOLD, more operations may be performed in this manner before charge leakage may result in loss of integrity of data stored in the memory cells 110.

The timing diagram 300 has been described with reference to a first digit line portion 202, a second digit line portion 204, a selector 206, and a selector 208. As described, however, in some embodiments, a plurality of second digit line portions may be included in a digit line. For example, as illustrated in FIG. 2, each of a plurality of second digit line portions 204 may be coupled to a first digit line portion 202 by a respective selector 206 and coupled to the VHOLD voltage by a respective selector 208.

As described, each digit line, such as the digit line 200 of FIG. 2, may comprise a digit line of a complementary digit line pair. In some instances, one digit line of each pair may be used to provide data between memory cells and a sense amplifier and the other digit line may be a reference digit line. In some embodiments, sense digit lines and reference digit lines need not be operated in a same manner. For example, as described, in response to a precharge command, a second digit line portion may be coupled to a first digit line portion. In some instances, only a sense digit line of a digit line pair may be coupled in this manner and a second digit line portion of a reference line of the digit line pair may remain decoupled from a respective first digit line portion.

Figure 4:
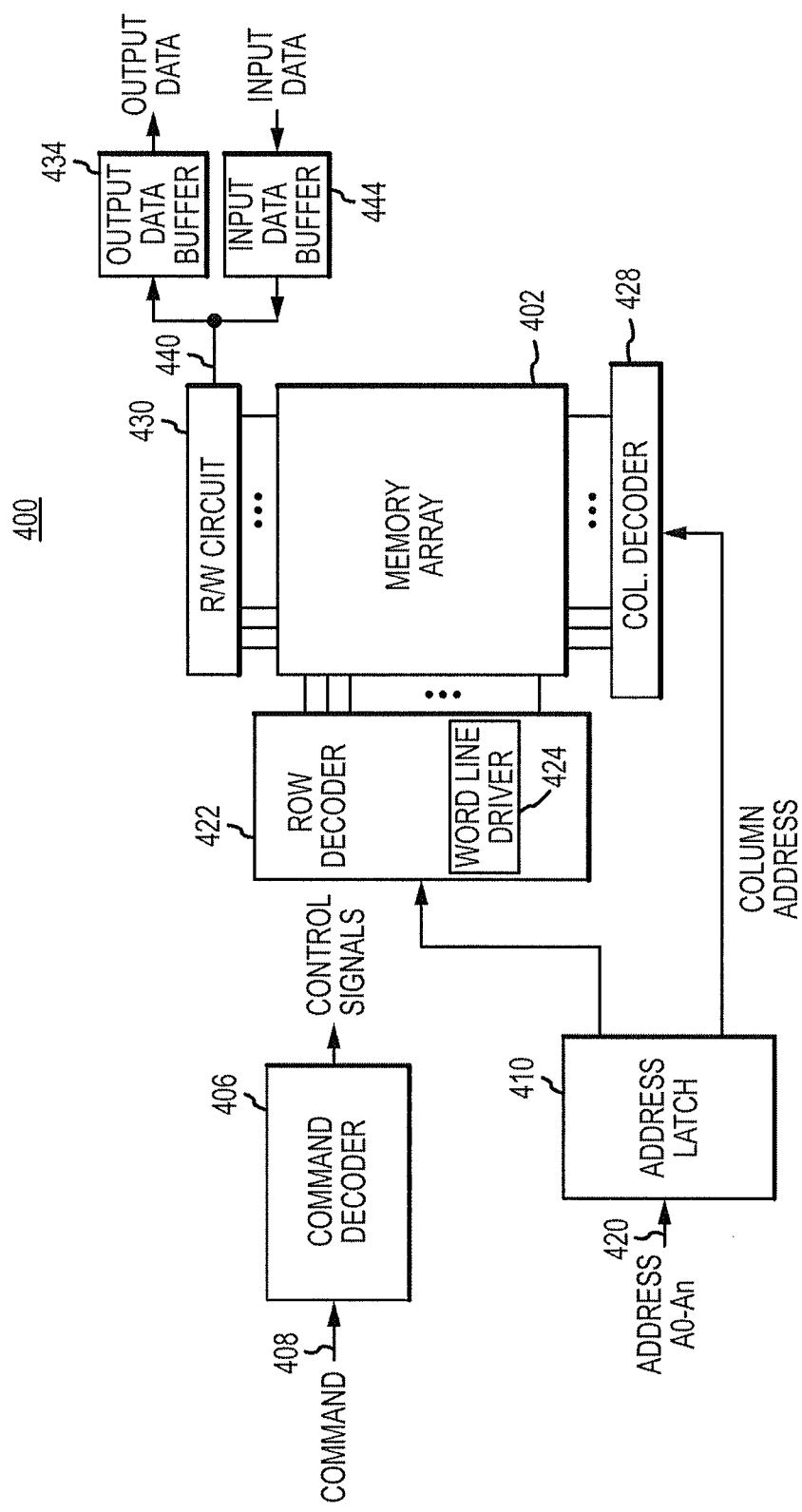
FIG. 4 is a schematic block diagram of a memory according to an embodiment of the invention.

FIG. 4 illustrates a memory 400 according to an embodiment of the invention. The memory 400 includes an array 402 of memory cells, which may be any memory cells, for example, DRAM memory cells, SRAM memory cells, flash memory cells, capacitive memory cells, resistive memory cells, non-volatile memory cells, and volatile memory cells. The array 402 may comprise, for instance, the array 102 of FIG. 1. The memory 400 includes an address/command decoder 406 that receives memory commands and addresses through an ADDR/CMD bus 408. The address/command decoder 406 generates control signals, based on the commands received through the ADDR/CMD bus 408. The address/command decoder 406 also provides row and column addresses to the memory 400 through an address bus 420 and an address latch 410. The address latch then outputs separate column addresses and separate row addresses.

The row and column addresses are provided by the address latch 410 to a row address decoder 422 and a column address decoder 428, respectively. The column address decoder 428 selects bit lines extending through the array 402 corresponding to respective column addresses. The bit lines of the array 402 may be hierarchical digit lines having first digit line portions and second digit line portions. Selectors may be used to couple the first and second digit line portions to provide stored data from the memory cells to sense amplifiers of array read/write circuitry 430, as well as couple second digit line portions to a VHOLD voltage. The bit lines of the array 402 and the selectors may be implemented as previously shown in and described with reference to FIG. 2. The row address decoder 422 may include a word line driver 424 that activates respective rows of memory cells in the array 402 corresponding to received row addresses. The row address decoder 422 may comprise, for instance, one or more of the row decoders 106 of FIG. 1.

The selected line (e.g., a digit line or digit lines) corresponding to a received column address are coupled to a read/write circuitry 430 to provide read data to a data output circuit 434 via an input-output data bus 440. Control signals for controlling the selectors (e.g., DLSEL and VHSEL) may be provided by the command decoder 406. The selectors may be controlled to couple the second digit line portions to the first digit line portions and to the VHOLD voltage, as previously described. Write data are provided to the memory array 402 through a data input circuit 444 and the memory array read/write circuitry 430. The memory array read/write circuitry 430 may include one or more sense amplifiers, such as the sense amplifiers 104 of FIG. 1.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a first digit line portion;
   a second digit line portion;
   a first selector configured to selectively couple the first digit line portion to the second digit line portion based, at least in part, on a first control signal, the first selector configured to couple the first digit line portion to the second digit line portion for a memory read operation including sensing data on the first digit line portion responsive to the first control signal and the first selector further configured to decouple the first digit line portion from the second digit line portion for a memory write operation responsive to the first control signal; and
   a second selector configured to selectively couple the second digit line portion to a voltage based, at least in part, on a second control signal, the second selector configured to couple the second digit line portion to the voltage during the memory write operation responsive to the second control signal.

2. The apparatus of claim 1, further comprising:
   a plurality of second digit line portions configured to be selectively coupled to the first digit line portion by the first selector.

3. The apparatus of claim 1, wherein the first selector is configured to couple the first digit line portion to the second digit line portion responsive, at least in part, to at least one of an activate command or a precharge command.

4. The apparatus of claim 1, wherein the first and second control signals are provided by a controller.

5. The apparatus of claim 1, wherein at least one of the first selector or the second selector comprises a multiplexer.

6. The apparatus of claim 1, wherein the first selector is configured to selectively couple the first digit line portion to the second digit line portion and the second selector is configured to selectively couple the second digit line portion to the voltage at a same time.

7. The apparatus of claim 1, wherein the second selector is configured to selectively couple the second digit line portion to the voltage after the first selector couples the first digit line portion to the second digit line portion.

8. The apparatus of claim 1, wherein the voltage comprises a precharge voltage.

9. An apparatus, comprising:
   a sense amplifier;
   a first digit line portion coupled to the sense amplifier;
   a second digit line portion;
   a first selector coupled to the first digit line portion and the second digit line portion, the first selector configured to couple the first digit line portion to the second digit line portion for a memory read operation including sensing data on the first digit line portion coupled to the sense amplifier and to decouple the first digit like portion from the second digit line portion for a memory write operation; and
   a second selector coupled to the second digit line portion and configured to couple the second digit line portion to a voltage during the memory write operation.

10. The apparatus of claim 9, wherein the first selector is further configured to decouple the first digit line portion from the second digit line portion responsive, at least in part, to a memory command.

11. The apparatus of claim 9, wherein the first and second digit line portions comprise a hierarchical digit line.

12. The apparatus of claim 11, wherein the first digit line portion comprises a metal digit line and the second digit line portion comprises a buried digit line.

13. A method, comprising:
   sensing at a sense amplifier stored data provided to a first digit line portion;
   decoupling a first plurality of second digit line portions from the first digit line portion;
   coupling a first plurality of second digit line portions to a hold voltage;
   coupling a second plurality of second digit line portions to the first digit line portion;
   after coupling the second plurality of second digit line portions to the first digit line portion, writing data via the first digit line portion to a memory cell that provided the stored data;
   decoupling the first plurality of second digit line portion from the hold voltage; and
   precharging the first digit line portion, first plurality of second digit line portions, and second plurality of second digit line portions.

14. The method of claim 13, wherein said decoupling the first plurality of second digit line portions from the first digit line portion occurs before said coupling the first plurality of second digit line portions to the hold voltage.

15. The method of claim 13, wherein the hold voltage comprises a precharge voltage.

16. The method of claim 13, wherein said coupling the second plurality of second digit line portions to the first digit line portions comprises:
   coupling the second plurality of second digit line portions to the first digit line portion responsive to a precharge command.

17. A method, comprising:
   coupling, using a first selector, a second digit line portion of a digit line to a first digit line portion of the digit line during sensing of data stored by a memory cell;
   decoupling the second digit line portion from the first digit line portion;
   writing data stored by the memory cell on the first digit line portion, wherein writing the data stored by the memory cell comprises:
      after decoupling the second digit line portion from the first digit line portion, coupling, using a second selector, the second digit line portion to a hold voltage after sensing the data stored by the memory cell;
      decoupling the second digit line portion from the hold voltage; and
      coupling the second digit line portion to the first digit line portion; and
   precharging the first and second digit line portions.

18. The method of claim 17, wherein coupling, using a first selector, a second digit line portion of a digit line to a first digit line portion of a digit line comprises:
   coupling, using a respective plurality of selectors, a plurality of second digit line portions of the digit line to the first digit line portion of the digit line.

19. The method of claim 17, wherein the hold voltage is a precharge voltage.

20. The method of claim 17, further comprising:
   decoupling, using the first selector, the second digit line portion of the digit line from the first digit line portion of the digit line.

21. The method of claim 17, wherein coupling, using a first selector, a second digit line portion of a digit line to a first digit line portion of the digit line is responsive, at least in part, to an activate command.

22. The method of claim 17, further comprising:
   activating a word line to couple a memory cell to the second digit line portion; and
   deactivating the word line to decouple the memory cell from the second digit line portion after sensing of the data.

23. The apparatus of claim 9, wherein while the second digit line portion is coupled to the voltage, the sense amplifier is provided with write data associated with a write command.

24. The method of claim 13, further comprising:
   providing the sense amplifier with write data corresponding to the stored data, the write data associated with a write command while the second digit line portion is coupled to the hold voltage.

* * * * *